US006342793B1

(12) United States Patent
Lukes et al.

(10) Patent No.: US 6,342,793 B1
(45) Date of Patent: Jan. 29, 2002

(54) METHOD AND SYSTEM FOR SENDING LARGE NUMBERS OF CMOS CONTROL SIGNALS INTO A SEPARATE QUIET ANALOG POWER DOMAIN

(75) Inventors: Eric John Lukes; James David Strom, both of Rochester; Dana Marie Woeste, Mantorville, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/433,394

(22) Filed: Nov. 3, 1999

(51) Int. Cl.[7] .......................................... H03K 19/0175
(52) U.S. Cl. ........................ 326/66; 326/113; 326/115; 327/287
(58) Field of Search ........................ 326/66, 113, 115; 327/287, 538, 537

(56) References Cited

U.S. PATENT DOCUMENTS 5,298,810 A * 3/1994 Scott et al. ..................... 326/66
5,465,057 A * 11/1995 Takahashi ..................... 326/66
5,598,114 A * 1/1997 Jamshidi ..................... 326/113
5,646,558 A * 7/1997 Jamshidi ..................... 326/106

OTHER PUBLICATIONS

BICMOS Emitter–Coupled Logic Converter for Extended Voltage Operation, IBM Technical Disclosure Bulletin, Mar. 1991, US. vol. 33 pp. 388–389.*

* cited by examiner

Primary Examiner—Michael Tokar
Assistant Examiner—Steven S. Paik
(74) Attorney, Agent, or Firm—Bracewell & Patterson LLP

(57) ABSTRACT

A CMOS signal transmission system for sending a large amount of CMOS signals into a separate quiet analog power domain. Transmission system comprises a converter subsystem which provides at least another device stage through which noise in the CMOS signals must flow and be attenuated to provide converted CMOS signals and a multiplexer coupled to the converter wherein the multiplexer receives converted CMOS signals from the converter sub-system and also receives delayed path control signals. The converter comprises a constant current source for providing a high level voltage reference and a constant current, two complimentary pass gates, and two sets of components for providing paths to ground from the constant current source through the two complimentary pass gates. When CMOS input signal is high and Complimentary CMOS input signal is low, the pass gate comprising transistors T9 and T1 is on and transistors T8 and T0 are off and connection BSEL is pulled high turning on bipolar transistor Q9 allowing current to flow through Q9 and pulling net SB low and selecting inputs B0, B1 to be transferred to ECL Differential Outputs. Likewise, when CMOS input signal is low and Complimentary CMOS input signal is high, pass gate comprising transistors T8 and T0 is on, and transistors T9 and T1 are off, and connection ASEL is pulled high turning on bipolar transistor Q8 allowing current to flow through Q8 and pulling net SA low and selecting inputs A0, A1 to be transferred to ECL Differential Outputs.

16 Claims, 6 Drawing Sheets

Fig. 1 *Prior Art*

METHOD AND SYSTEM FOR SENDING LARGE NUMBERS OF CMOS CONTROL SIGNALS INTO A SEPARATE QUIET ANALOG POWER DOMAIN

BACKGROUND OF THE INVENTION

1. Technical Field

The present invention relates in general to a method and system for sending large numbers of CMOS control signals into a separate quiet analog power domain and, in particular, to a method and system for sending large numbers of CMOS control signals into a separate quiet analog power domain on the same chip without detrimental noise transmission into the quiet power domain.

2. Description of the Related Art

In mixed signal designs having large amounts of CMOS logic, generally any CMOS control signals that need to connect and feed to circuitry in a quiet analog power domain are converted to low level differential signals before being used therein. Furthermore, any switching CMOS circuitry in the analog power domain must be kept to a minimum and somewhat isolated so that switching noise is not introduced onto the quiet analog power supply. Another concern in these mixed signal designs is the transmission of noise on the noisy logic power supply to the quiet power supply.

Problems occur for these designs when a large number, such as one hundred (100) or more, CMOS control signals need to be used in the analog power domain. Converting such a large number of signals to differential signals in the traditional way while also maintaining a small chip size is not at all practical. For example, such a conversion would require as many CMOS switching circuits in the analog power domain as signals to be converted, thus introducing a large amount of switching noise to the quiet analog power domain.

With reference now to the figures and in particular with reference to FIG. 1, a traditional or conventional prior art CMOS conversion multiplexer 10 that is used for converting CMOS signals to differential signals is shown. The CMOS conversion multiplexer 10 comprises various bipolar transistors 12, various field effect transistors (FETs) 14, a CMOS inverter 16, constant current sources 18, and various resistors 20 coupled together in the manner shown in FIG. 1. A power supply voltage VDD1 24 is applied to the multiplexer 10, and the multiplexer 10 is grounded at GND1 25 for proper operation of the multiplexer.

The general operations of multiplexer 10 is described as follows: The CMOS signal is sent into the multiplexer 10 at CMOS input signal 15. A CMOS signal is defined as a signal whose low level is 0V and its high level is the power supply. The signal A2 is in the analog part of the domain. If A2 is high, then the CMOS signal turns on the transistor Q9 and the collector of Q9 is pulled low. If A2 is low, then the CMOS signal turns on the transistor Q10 and the collector of Q10 is pulled low. Transistors Q9 and Q10 are a current steering differential pair meaning that the current through the current source is constant and either goes through Q9 or Q10 depending on the value of A2. The base of Q9 is either driven to the voltage value of VDD1 when it is on or is clamped by Q3 to 1 diode below VDD1 when it is off. Meanwhile, the base of Q10 is connected to a voltage divider whereas the base is held to a constant voltage that is a 1/2 diode below VDD1. The generally noisy input signal 15 is converted to low voltage level differential signals by the converter portion 10A of the circuit. Low level differential or ECL signals can be defined as two signals whose amplitude is small, for example 300 mV, and whose phase relationship is such that one is at its low voltage while the other is at its high voltage. This phase relationship is sometimes called 180 degrees out of phase. The outputs of the converter circuit 10A are used as inputs to the differential multiplexer 10B called MA and MB. When MB is high the ECL inputs B0 and B1 are transferred to the ECL Differential Outputs and when MA is high the ECL inputs A0 and A1 are transferred to the ECL Differential Outputs. For example, this could be a method by which a designer could use a control loop to choose dynamically between two delays of differing values. A0, A1 is chosen by the multiplexer 10 when A2 is high, and B0, B1 is chosen by the multiplexer 10 when A2 is low. Thus, the CMOS conversion multiplexer 10 chooses between two values in a control loop.

One problem with conversion multiplexer 10 is that it requires accurate current sources 18 and careful layout. Another problem is that it requires the CMOS signal to be referenced in the quiet power supply by using at least one CMOS inverter. Furthermore, for processing a large amount of signals, a conversion multiplexer 10 would be required for each signal to be converted. The current mirrors required for that many circuits would require a large amount of chip area. Also, the conversion of CMOS signals to differential signals is performed in a multiplexer 10, which is able to be viewed as one, single stage of circuits, but it requires a large amount of area, careful control of current and would inject switching noise on the quiet power supply by means of the CMOS inverter 16. At least one CMOS inverter for each signal to be converted is required on the quiet power supply. The injection of noise onto the quiet power supply is a means by which, for example, an accurate delay could be undesirably modulated.

With reference now to the figures and in particular with reference to FIG. 2, another CMOS conversion multiplexer 11 is shown. The multiplexer 11 is used to attempt to accomplish the conversion of CMOS logic signals into differential signals. The multiplexer 11 further comprises various bipolar transistors 12, various FETs 14, a current source 18, and various resistors 20 coupled in the manner shown in FIG. 2. Parasitic capacitance 26 are shown to exist at the various areas in FIG. 2. Also, power supply voltage VDD1 24 is used to drive the multiplexer 11, and the multiplexer 11 is coupled to ground GND1 25 for proper operations of the multiplexer 11.

The general operations of the multiplexer 11 is described as follows: The current source 18 provides a constant accurate current source for the multiplexer. The CMOS input signal is sent in as the MB signal which is inputted to the PFET T0 while the complimentary CMOS input signal (180 degrees out of phase from the CMOS input signal) is sent in as the MA which is inputted to the PFET T1. As stated earlier, the MA and MB signals will be relatively noisy signals. The PFET T0 provides an A-Select signal while the PFET T1 provides a B-Select signal. The PFETs T0 and T1 are driven from 0 to VDD1 with what are considered CMOS control signals. The transistors 12 are driven by the ECL low level differential signals 28. However, parasitic capacitances exist from the gate to the drain and the gate to the source of the PFETs T0 and T1. Parasitic capacitances also exist from the base to the emitter and the base to the collector of the bipolar transistors Q4 and Q5. The parasitic capacitances provides paths to communicate noise from power supplies that have a lot of switching noise on them and logic power supplies. CMOS signals look like CMOS input signal 15 in FIG. 3. differential signals 28. However, parasitic capacitances exist from the gate to the drain and the gate to the source of the PFETs T0 and T1. Parasitic capacitances also exist from the base to the emitter and the base to the collector of the bipolar transistors Q4 and Q5. The parasitic capacitances provides paths to communicate noise from power supplies that have a lot of switching noise on them and logic power supplies. CMOS signals look like CMOS input signal 15 in FIG. 3.

If the CMOS input signal 15 is connected directly to converter inputs MB and MA, the noise that is coupled to the outputs P10, P11 was unacceptable even though the design was compact and simple. Also to prevent problems that could be caused by ground shift between the two power domains, the incoming CMOS signals should be referenced to the analog power supplies to ensure full switching of the PFET. This referencing can be done using the CMOS inverters 16, but it introduces switching noise onto the quiet analog power supply VDD1. Also, the conversion of CMOS signals to differential signals is performed in a multiplexer 11, which is able to be viewed as one, single stage of circuits. When the signal MB is low, the signals A0, A1 are selected and when the signal MA is low, the signals B0, B1 are selected. This circuit, for example, could also be used to choose between two delays of different values by means of a control loop. Another problem with this design is that noise from the CMOS signals would be transmitted to a sensitive net by means of the parasitic capacitances 26. This noise transmission would modulate the delay of the multiplexer and affect as in the previous example the value of the precise delays desired.

In multiplexer 11, modulation of the desired value an the output may be a result of noise 34 (i.e. see FIG. 3) from the CMOS input signal 15 or subsequent signals MA, MB therefrom modulating the voltage on sensitive circuit nets such as S1 and S2 and thereby modulating the delay of the multiplexer 11. Noise may also be introduced to the non-noisy analog power supply in both multiplexers 10 and 11 from injection noise caused by CMOS switching devices switching on and off in the circuits denoted by the number 16 that are necessary to avoid problems caused by possible ground shift between the CMOS logic power domain and quiet analog power domain. The detail explanation of such switching and noise is shown in drawing 38 of prior art FIG. 4 (i.e. noise on power supply exists). In this case, the noise may be caused by current turning on and off every time devices are switched on and off. For example, the desired type of circuit in a quiet power domain is constant current circuits 18 in FIGS. 1 and 2. The circuits 16 in FIGS. 1 and 2 draw current when the output is changing state. Otherwise, it does not draw current. If a significant number of these types of circuits exist on the quiet power supply, the voltage of that power supply drops when the current is on and the voltage of the power supply rises when the current is off. In FIG. 2, the noise from either source, the switching on and off of current, or the transmission of noise via parasitic capacitances varies the delay of the multiplexer 11. The noise is detrimental in most analog applications.

Previous designs either had too much noise gain from the input to the output, required too many CMOS switching circuits on the quiet power supply, or were too complicated and large to use for converting a large amount of CMOS control signals. Generally, noise is desired to be eliminated or attenuated as much as possible from the noisy signal (i.e. CMOS input or even MA and MB signals) so that it is eliminated or minimized in effect on the output of the multiplexer. Furthermore, regarding FIG. 2, if nothing is done about the ground shift between GND1 and the logic ground, then CMOS inverters need to be placed on the analog power supply. These CMOS inverters also introduce switch noise onto the quiet analog power supply.

It is therefore advantageous and desirable to convert the CMOS signals in a simpler way while attenuating the noise transmitted to the small signal and to the quiet power supply from the large swing signal and the noisy logic power supply. It is also advantageous and desirable to eliminate the requirement of converting the control signals to low level differential signals in a traditional way before using them in a quiet analog power domain. It is further advantageous and desirable to eliminate the requirement of CMOS level switching circuitry on the quiet power domain. It is still also advantageous and desirable to provide a mixed signal design with large amounts of CMOS logic that reduces the noise gain from the input of the CMOS signal to the output of the low level differential circuit over previous designs. It is still further advantageous and desirable to provide a mixed signal design with large amounts of CMOS logic that reduces noise transmission from the large swing signal over previous designs. It is still further advantageous and desirable to provide a mixed signal design with large amounts of CMOS logic that reduces the transmission of noise on the signal from the logic power supply when the signal is at a steady state high or low over previous designs. It is still also advantageous and desirable to provide a CMOS conversion circuit design that overcomes the problems of the prior art such as having too much noise gain from the input to the output, requiring too many CMOS switching circuits on the quiet power supply, or being too complicated and large to use for converting a large amount of CMOS control signals.

SUMMARY OF THE INVENTION

It is therefore one object of the present invention to convert the CMOS signals in a simpler way while attenuating the noise transmitted to the small signal and to the quiet power supply from the large swing signal and the noisy logic power supply.

It is another object of the present invention to eliminate the requirement of converting the control signals to low level differential signals in a traditional way before using them in a quiet analog power domain.

It is a further object of the present invention to eliminate the requirement of CMOS level switching circuitry on the quiet power domain.

It is still also an object of the present invention to provide a mixed signal design with large amounts of CMOS logic that reduces the noise gain from the input of the CMOS signal to the output of the low level differential circuit over previous designs.

It is still a further object of the present invention to provide a mixed signal design with large amounts of CMOS logic that reduces noise transmission from the large swing signal over previous designs.

It is still another object of the present invention to provide a mixed signal design with large amounts of CMOS logic that reduces the transmission of noise on the signal from the logic power supply when the signal is at a steady state high or low over previous designs.

It is still another object of the present invention to provide a CMOS conversion circuit design that overcomes the problems of the prior art such as having too much noise gain from the input to the output, requiring too many CMOS switching circuits on the quiet power supply, or being too complicated and large to use for converting a large amount of CMOS control signals.

The foregoing objects are achieved as is now described. A CMOS signal transmission system for sending a large amount of CMOS signals into a separate quiet analog power domain. Transmission system comprises a converter sub-system which provides at least another device stage through which noise in the CMOS signals must flow and be attenuated to provide converted CMOS signals and a multiplexer coupled to the converter wherein the multiplexer receives converted CMOS signals from the converter sub-system and also receives delayed path control signals. The converter comprises a constant current source for providing a high level voltage reference and a constant current, two complimentary pass gates, and two sets of components for providing paths to ground from the constant current source through the two complimentary pass gates. When CMOS input signal is high and Complimentary CMOS input signal is low, the pass gate comprising transistors T9 and T1 is on and transistors T8 and T0 are off and connection BSEL is pulled high turning on bipolar transistor Q9 allowing current to flow through Q9 and pulling net SB low and selecting inputs B0, B1 to be transferred to ECL Differential Outputs. Likewise, when CMOS input signal is low and Complimentary CMOS input signal is high, pass gate comprising transistors T8 and T0 is on, and transistors T9 and T1 are off, and connection ASEL is pulled high turning on bipolar transistor Q8 allowing current to flow through Q8 and pulling net SA low and selecting inputs A0, A1 to be transferred to ECL Differential Outputs.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
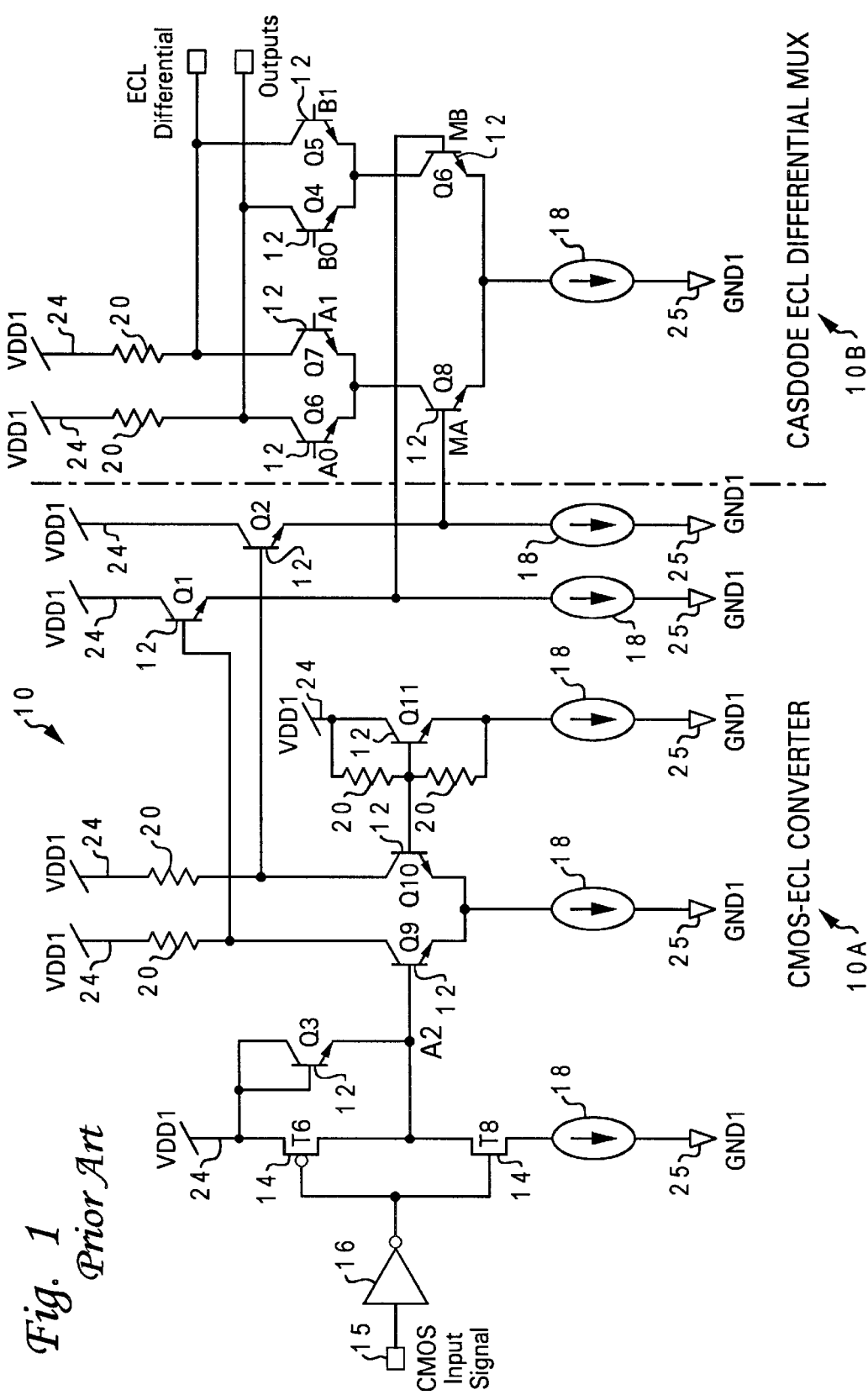
FIG. 1 is a prior art general schematic diagram of a conventional or traditional multiplexer for converting CMOS signals to differential signals that are sent to a quiet analog power domain wherein the multiplexer has problems associated with converting a large amount of CMOS signals.

The present invention is a signal transmission system 40 for sending a large number of CMOS signals into a separate quiet analog power domain. The signal transmission system 40 provides at least three key advantages. First, the noise gain from input to output of the transmission system 40 is greatly reduced. The noise gain from the input to the output makes the noise introduced much smaller than the amplitude of the small signal swing. Secondly, the design of the transmission system 40 is relatively small, and it does not require accurate current sources or undue complexity. Thirdly, the design of the transmission system 40 does not require any CMOS level switching circuitry on the analog power supply which both the designs in prior art FIGS. 1 and 2 require. In fact, the transmission system 40 eliminates the requirement of referencing the control signals to the quiet analog power domain before using them in the quiet power domain.

The present invention CMOS signal transmission system 40 generally involves adding at least one more device stage (i.e. converter 44) between the noisy signal (i.e. MA, MB) and the signal that is desired to not be contaminated (i.e. the delay path control signals A0, A1 and B0, B1) by creating and/or providing the ASEL (A select) signal and the BSEL (B select) signal. The converter 44 provides that at least one device stage to attenuate the noise in the noisy signals MA, MB (i.e. from the CMOS signal) and provide less noisy ASEL and BSEL signals. These attenuated ASEL and BSEL signals are outputted from the converter 44 and inputted and used in the multiplexer 42.

Figure 5:
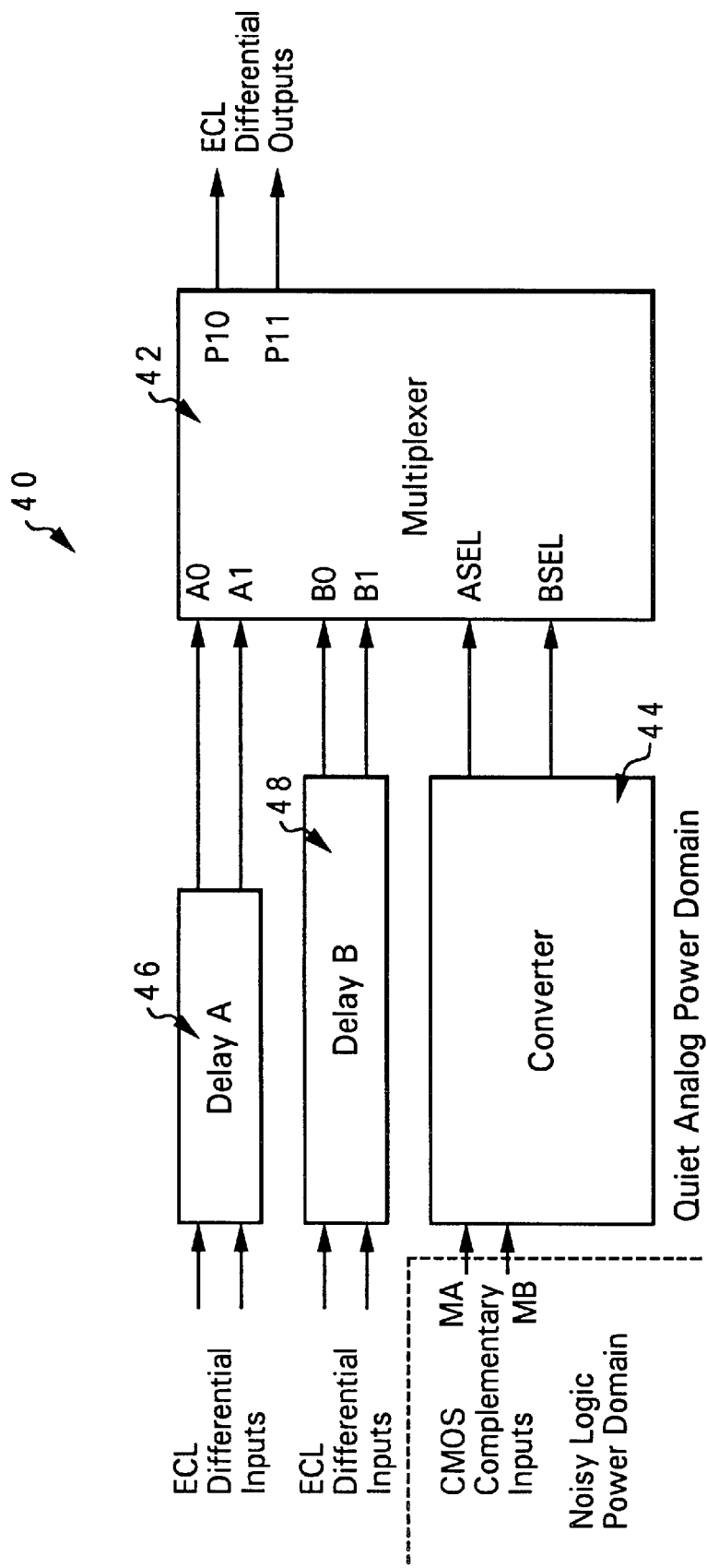
FIG. 5 is a block diagram showing the topology of the present invention CMOS signal transmission system for sending a large amount of CMOS signals into a quiet analog power domain.
Figure 7:
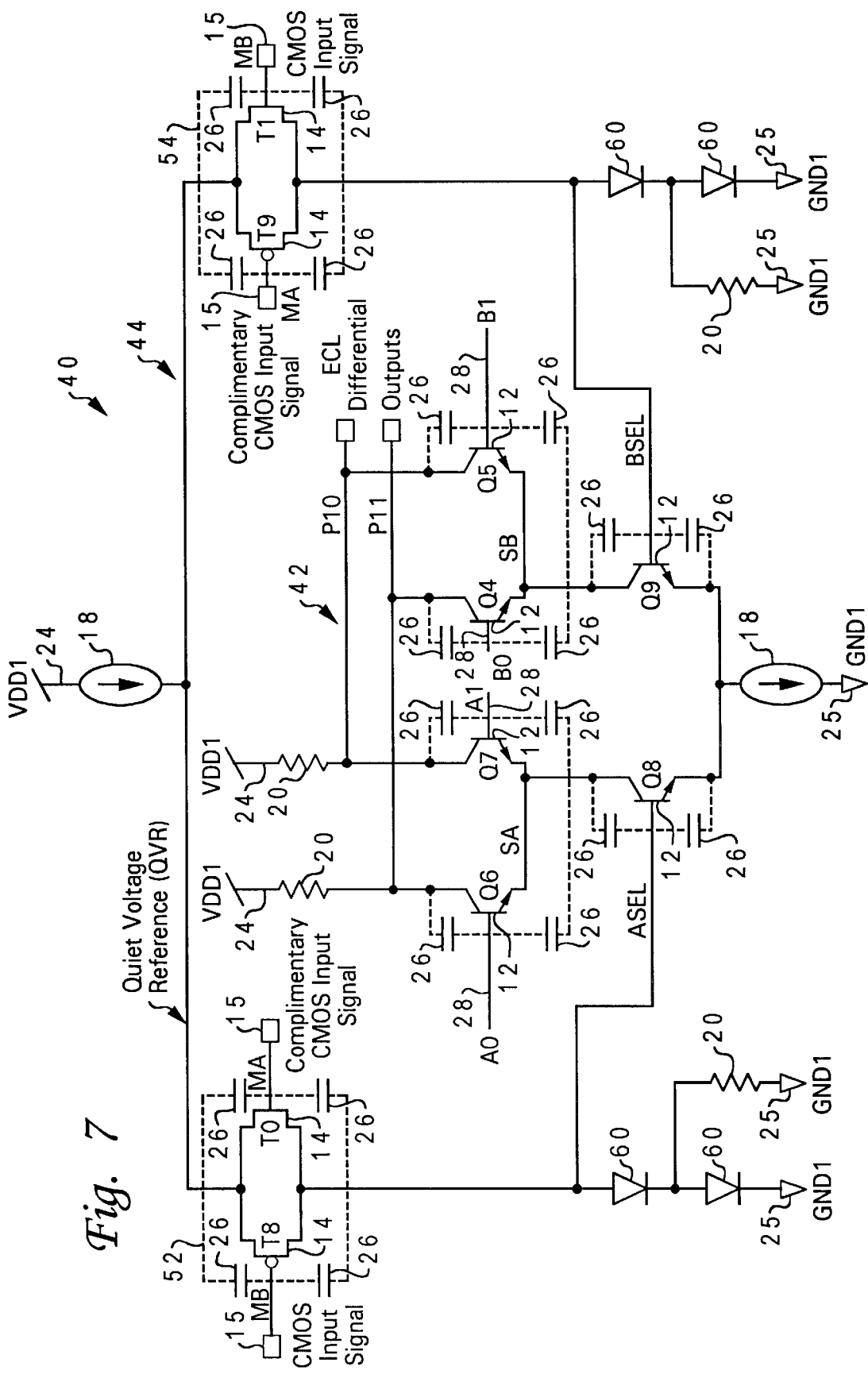
FIG. 7 is a schematic diagram showing the circuitry of the present invention CMOS signal transmission system.

With reference now to the figures and in particular with reference to FIG. 5, a block diagram is shown of the topology of the present invention CMOS signal transmission system 40. The CMOS signal transmission system 40 is capable of sending a large amount of CMOS signals into a quiet analog power domain. FIG. 5 shows that the transmission system 40 comprises a multiplexer 42, a converter sub-system 44, a Delay A block 46, and a Delay B block 48. The multiplexer 42, the converter sub-system 44, the Delay A block 46, and the Delay B block 48 are coupled in the manner shown in FIG. 5. The control signals A0, A1 and B0, B1 are inputted into the Delay A and B blocks 46 and 48 to provide delay path control signals A0, A1 and B0, B1 for the control signal delay paths to the multiplexer 42. The delayed signals from the Delay A and B blocks 46 and 48 are inputted into the A0, A1, B0, B1 input pins of the multiplexer 42. The MA and MB signals, which will be discussed in more detail later with reference to FIG. 7, are inputted to the converter sub-system 44. The MA and MB signals are from the CMOS input signals as discussed earlier in the description of the related art section. The outputs of the converter sub-system 44 are input into the ASEL and BSEL input pins of the multiplexer 42. The multiplexer 42 provides and outputs the converted quite domain signals P10, P11.

Figure 2:
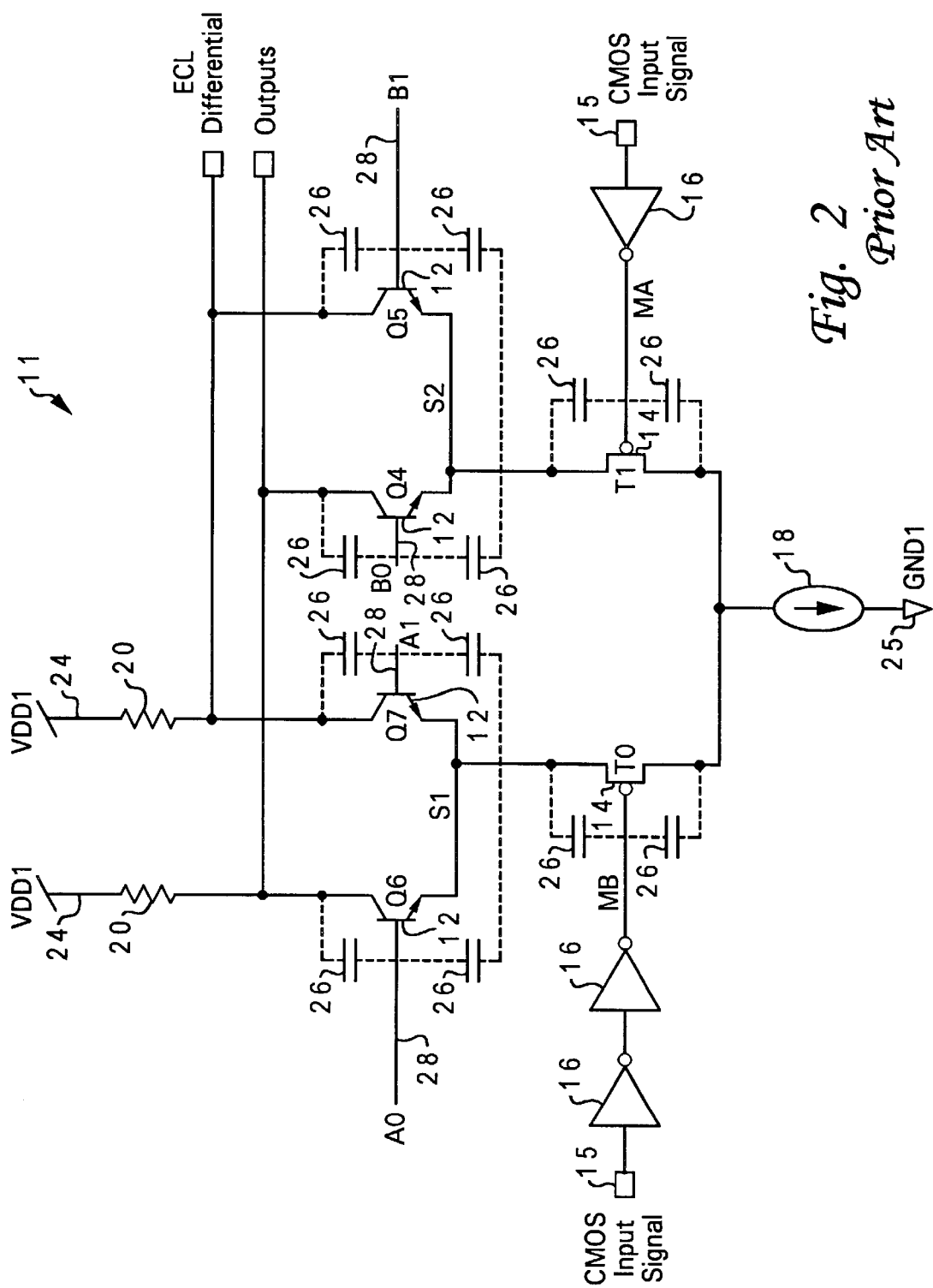
FIG. 2 is a general schematic diagram of another previously designed multiplexer for converting CMOS signals to differential signals that are sent to a quiet analog power domain wherein the multiplexer has problems associated with converting a large amount of CMOS signals.
Figure 3:
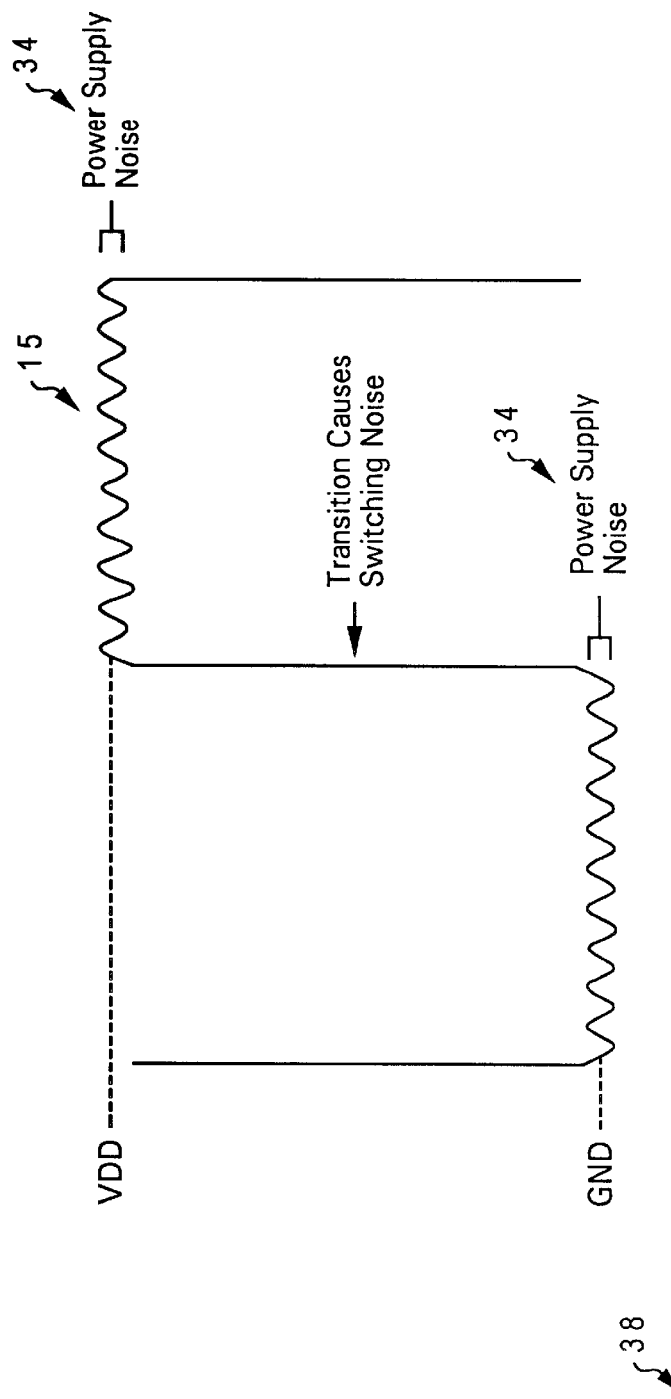
FIG. 3 is a general prior art diagram illustrating the effects of noise on a power supply signal from a power supply.
Figure 4:
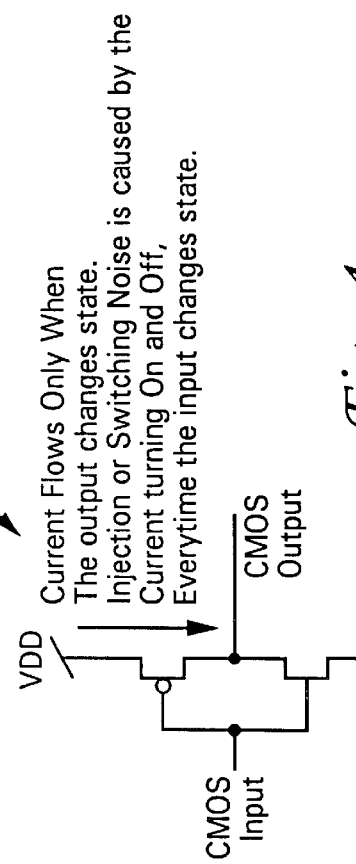
FIG. 4 is a general prior art diagram illustrating the injection of noise caused by current turned on and off by devices being switched.

The multiplexer 42 is generally a standard, conventional prior art multiplexer, such as multiplexer 11 of FIG. 2, as discussed in the description of the related art. However, the converter sub-system 44 provides a key and unique system in that a separate constant circuit source circuit system and another device stage are provided through which the noisy input signal has to flow. With reference now to the figures and in particular with reference to FIG. 6, the converter sub-system 44 comprises a constant current source 50, complimentary switches 51 and 53 respectively provided by a MB/MA complimentary pass gate 52 and a MA/MB complimentary pass gate 54, diodes 60, and resistors 20, which are coupled together in the manner shown in FIG. 6. The MA and MB signals are input at and directed to the corresponding and respective complimentary pass gate 52 or 54 depending on which switch 51 or 53 is to be opened and which one is to be closed. Either switch 51 or 53 is closed while the other switch is open (i.e. complimentary switches).

Figure 6:
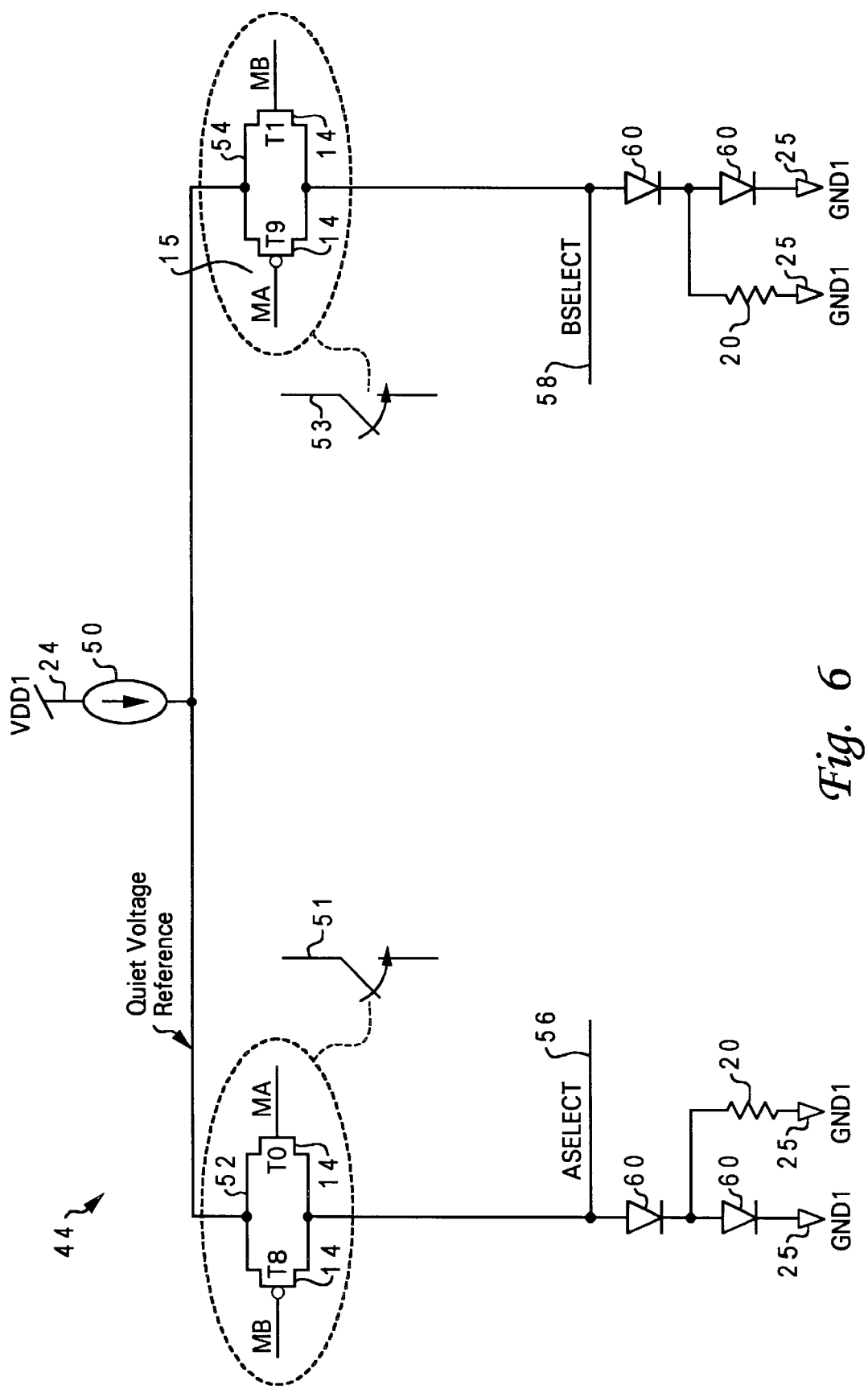
FIG. 6 is a general diagram of the circuitry for the converter sub-system of the present invention CMOS signal transmission signal shown in FIG. 5.

The MB/MA complementary pass gate 52 comprises a PFET T8 for the MB signal and a NFET T0 for the MA signal having parasitic capacitance 26 as illustrated in FIG. 7 at various locations. FIG. 6 also shows that the MA/MB complimentary pass gate 54 comprises a PFET T9 for the MA signal and a NFET T1 for the MB signal having parasitic capacitance at the various respective locations shown. Even though the parasitic capacitance 26 does provide some level of noise to the transmission system 40, the fact that the converter sub-system 44 provides another device stage through which the MA and MB signals have to flow provides additional and further attenuation of the noise gain, thus offsetting the disadvantage of the added noise by the parasitic capacitance. Attenuation is provided since the noise gain is less than one between the device stages. The present CMOS signal transmission system 40 provides one more device stage (i.e. two devices instead of one device) between the noisy signal and the signal (i.e. quiet domain signals) that is not desired to be contaminated.

The current source 50 driven by power supply 24 supplying VDD1 as shown in FIG. 6 provides a constant current source. In the prior art, the current source was provided from instantaneous switching. In the present invention, the switching, however, is CMOS switching or complimentary CMOS switching that results in further noise in the circuit, which is translated through the circuit through noise gain. Thus, the present invention provides a high level voltage source from constant current source steering. The two diodes 60 on the left side of the converter sub-system 44 make and set the ASEL signal two diodes above ground. The two diodes 60 on the right side of the converter sub-system 44 make and set the BSEL signal two diodes above ground. The diodes 60 provide a path to ground for the constant current source 50 through the respective complimentary pass gate 52 or 54. The resistors 20 coupled in parallel to the bottom diodes 60. The resistors 20 are each used to keep the respective bottom diode 60 on for allowing the current from the constant current source 50 to be able to flow to the path to ground.

Generally, when the MA signal is high and the MB signal is low, then the switch 51 for ASEL 56 (i.e. A Select or ASELECT) is closed and the complimentary switch 53 for BSEL 58 (i.e. B Select or BSELECT) is open. In this case, the high voltage reference provided from the constant current source 50 is transferred to the ASEL output 56 as shown in FIG. 6. On the other hand, when the MA signal is low and the MB signal is high, then the switch 51 for ASEL 56 is open and the complimentary switch 53 for BSEL 58 is closed. In this case, the high voltage reference provided from the constant current source 50 is transferred to the BSEL output as shown in FIG. 6. The ASEL and BSEL outputs 56 and 58 are fed to the multiplexer 42 as shown in FIG. 5. The design of the converter sub-system 44 providing current steering allows bi-polar junction transistors (BJTs) Q8 and Q9 to be used and receive the ASEL and BSEL signals 56 and 58 in the multiplexer 42. The BJTs provide better and more sensitive switches for current steering. FETs are such that when one switches on, the other may not necessarily be off. The BJTs are such that when one switches on, the other is off.

With reference now to the figures and in particular with reference to FIG. 7, a specific circuit diagram of the present invention CMOS signal transmission system 40 is shown. In FIG. 7, the ECL cascade multiplexer 42 is shown in the interior of and surrounded by the circuit for the converter 44 (i.e. same circuit shown in FIG. 6). The ECL cascade multiplexer 42 comprises BJTs 12, current source 18, VDD1 power supplies 24, and resistors 20 that are coupled in the manner shown in FIG. 7. Control signals A0, A1 and B0, B1 are inputted into the multiplexer 42 at respective BJTs 12, and the respective BJTs 12 provide the ECL differential output signal P10 and the outputs P11. The converter sub-system 44 in FIG. 7 comprises the same components as the converter sub-system shown in FIG. 6 (i.e. FETs T8, T0, T9, T1 14, four diodes 60, two resistors 20, a constant current source 50, and a VDD1 power supply 24). The circuit for the multiplexer 42 is coupled to the circuit for the converter sub-system 44 in the manner shown in FIG. 7. Regarding FIG. 7, the ASEL signal is driven by the quiet voltage reference (QVR), which is getting contaminated with noise from signals MA and MB. Parasitic capacitance 26 exist at the locations shown in the circuit diagram of FIG. 7. The parasitic capacitance always communicate noise, but as a noisy signal goes through more stages, the more the noise is attenuated since noise gain is generally less than one through each stage. A power supply voltage VDD1 24 is applied to the transmission system 40 at the respective places shown in FIG. 7, and the transmission system 40 is grounded at GND1 25 for proper operations of the transmission system 40.

Thus, transmission system 40 comprises a converter sub-system 44 which provides at least another device stage through which noise in the CMOS signals must flow and be attenuated to provide converted CMOS signals and a multiplexer 42 coupled to the converter 44 wherein the multiplexer 42 receives converted CMOS signals from the converter sub-system 44 and also receives delayed path control signals. The converter 44 comprises a constant current source 18 for providing a high level voltage reference and a constant current, two complimentary pass gates 52 and 54, and two sets of components for providing paths to ground from the constant current source through the two complimentary pass gates 52 and 54. When CMOS input signal is high and Complimentary CMOS input signal is low, the pass gate 54 comprising transistors T9 and T1 is on and the pass gate 52 comprising transistors T8 and T0 are off and connection BSEL is pulled high turning on bipolar transistor Q9 allowing current to flow through Q9 and pulling net SB low and selecting inputs B0, B1 to be transferred to ECL Differential Outputs. Likewise, when CMOS input signal is low and Complimentary CMOS input signal is high, pass gate 52 comprising transistors T8 and T0 is on, and pass gate 54 comprising transistors T9 and T1 are off, and connection ASEL is pulled high turning on bipolar transistor Q8 allowing current to flow through Q8 and pulling net SA low and selecting inputs A0, A1 to be transferred to ECL Differential Outputs.

While the invention has been particularly shown and described with reference to a preferred embodiment, it will be understood by those skilled in the art that various changes in form and detail may be made therein without departing from the spirit and scope of the invention.

What is claimed is:

1. A converter system for use in a transmission system having a multiplexer for sending a large number of CMOS signals into a quiet analog power domain wherein the converter circuit is coupled to the multiplexer comprising:
   a constant current source for providing a high level voltage reference,
   one complementary pass gate coupled on one side of the constant current source wherein the one complementary pass gate acts as one complementary switch wherein a first CMOS signal input and a second CMOS signal input that is complementary to the first CMOS signal input are provided to the one complementary pass gate and wherein the one complementary pass gate is closed to provide the one complementary switch as closed and a first output of the CMOS signals is selected through the one complementary pass gate when the first CMOS signal input is high and the second CMOS signal input is low, one set of components coupled to the one complementary pass gate wherein the one set of components provide a path to ground from the constant current source through the one complementary pass gate, the one set of components for providing the one path to ground further comprising two diode components and a resistor wherein an end of one of the two diodes is coupled to the one complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground, another complementary pass gate coupled on another side of the constant current source wherein the another complementary pass gate acts as another complementary switch wherein the another complementary pass gate is complementary to the one complementary pass gate and wherein the second CMOS signal input and the first CMOS signal input are provided to the another complementary pass gate and wherein the another complementary pass gate is closed to provide the another complementary switch as closed and a second output of the CMOS signals is selected through the another complementary pass gate when the first CMOS signal input is low and the second CMOS signal input is high, and another set of components coupled to the another complementary pass gate wherein the another set of components provide another path to ground from the constant current source through the another complementary pass gate.

2. The converter system according to claim 1, wherein:

the one complementary pass gate comprises a first field effect transistor and a second field effect transistor wherein a drain and a source of the first field effect transistor are respectively coupled to a drain and a source of the second field effect transistor and wherein a gate of the first field effect transistor receives the first CMOS signal input and a gate of the second field effect transistor receives the second CMOS signal input and wherein the first output of the CMOS signals is provided at the drain of the first field effect transistor and the drain of the second field effect transistor when the one complementary pass gate is closed, the another complementary pass gate comprises a third field effect transistor and a fourth field effect transistor wherein a drain and a source of the third field effect transistor are respectively coupled to a drain and a source of the fourth field effect transistor and wherein a gate of the third field effect transistor receives the first CMOS signal input and a gate of the second field effect transistor receives the second CMOS signal input and wherein the second output of the CMOS signals is provided at the drain of the third field effect transistor and the drain of the fourth field effect transistor when the another complementary pass gate is closed, and wherein parasitic capacitance exist within the one complementary pass gate and the another complementary pass gate.

3. The converter system according to claim 1, wherein:

the another set of components for providing the another path to ground further comprises two diode components and a resistor wherein an end of one of the two diodes is coupled to the another complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground.

4. The converter system according to claim 1, wherein the converter system provides at least another device stage through which noise in the CMOS signals must flow and be attenuated.

5. A method of converting and sending a large number of CMOS signals through a transmission system into a quiet analog power domain comprising:

providing a high level voltage reference from a constant current source, coupling one complementary pass gate that acts as one complementary switch on one side of the constant current source and another pass gate that acts as another complementary switch to another side of the constant current source, coupling one set of components to the one complementary pass gate for providing one path to ground from the constant current source through the one complementary pass gate, wherein the one set of components further comprises two diode components and a resistor wherein an end of one of the two diodes is coupled to the one complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground, coupling another set of components to the another complementary pass gate for providing another path to ground from the constant current source through the another complementary pass gate, receiving a first CMOS signal input and a second CMOS signal input at the one complementary pass gate and receiving the second CMOS signal input and the first CMOS signal input at the another complementary pass gate, closing the one complementary pass gate to provide the one complementary switch as closed, opening the another complementary pass gate to provide the another complementary switch as open, and selecting a first output of the CMOS signals from the one complementary pass gate when the first CMOS signal input is high and the second CMOS signal input is low, and opening the one complementary pass gate to provide the one complementary switch as open, closing the another complementary pass gate to provide the another complementary switch as closed, and selecting a second output of the CMOS signals from the another complementary pass gate when the first CMOS signal input is low and the second CMOS signal input is high.

6. The method according to claim 5, wherein:

the one complementary pass gate comprises a first field effect transistor and a second field effect transistor wherein a drain and a source of the first field effect transistor are respectively coupled to a drain and a source of the second field effect transistor and wherein a gate of the first field effect transistor receives the first CMOS signal input and a gate of the second field effect transistor receives the second CMOS signal input and wherein the first output of the CMOS signals is provided at the drain of the first field effect transistor and the drain of the second field effect transistor when the one complementary pass gate is closed, the another complementary pass gate comprises a third field effect transistor and a fourth field effect transistor wherein a drain and a source of the third field effect transistor are respectively coupled to a drain and a source of the fourth field effect transistor and wherein a gate of the third field effect transistor receives the first CMOS signal input and a gate of the fourth field effect transistor receives the second CMOS signal input and wherein the second output of the CMOS signals is provided at the drain of the third field effect transistor and the drain of the fourth field effect transistor when the another complementary pass gate is closed, and wherein parasitic capacitance exist within the one complementary pass gate and the another complementary pass gate.

7. The method according to claim 5, wherein:

the another set of components for providing the another path to ground further comprises two diode components and a resistor wherein an end of one of the two diodes is coupled to the another complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground.

8. A transmission system for sending a large number of CMOS signals into a quiet analog power domain comprising:

a converter sub-system which provides at least another device stage through which noise in the CMOS signals must flow and be attenuated to provide converted CMOS signals, wherein the converter sub-system further comprises:

a constant current source for providing a high level voltage reference, one complementary pass gate coupled on one side of the constant current source wherein the one complementary pass gate acts as one complementary switch wherein a first CMOS signal input and a second CMOS signal input that is complementary to the first CMOS signal input are provided to the one complementary pass gate and wherein the one complementary pass gate is closed to provide the one complementary switch as closed and a first output of the CMOS signals is selected through the one complementary pass gate when the first CMOS signal input is high and the second CMOS signal input is low, one set of components coupled to the one complementary pass gate, wherein the one set of components provide a path to ground from the constant current source through the one complementary pass gate, and wherein the one set of components further comprises two diode components and a resistor wherein an end of one of the two diodes is coupled to the one complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground, another complementary pass gate coupled on another side of the constant current source wherein the another complementary pass gate acts as another complementary switch wherein the another complementary pass gate is to the one complementary pass gate and wherein the second CMOS signal input and the first CMOS signal input are provided to the another complementary pass gate and wherein the another complementary pass gate is closed to provide the another complementary switch as closed and a second output of the CMOS signals is selected through the another complementary pass gate when the first CMOS signal input is low and the second CMOS signal input is high, and another set of components coupled to the another complementary switch wherein the another set of components provide another path to ground from the constant current source through the another complementary pass gate, and a multiplexer coupled to the converter sub-system wherein the multiplexer receives the converted CMOS signals from the converter sub-system and also receives path control signals for controlling path flow of the converted CMOS signals.

9. The transmission system according to claim 8, wherein the path control signals are a first delayed path control signal and a second delayed path control signal and wherein the transmission system further comprises:

a first delay sub-system coupled to the multiplexer wherein the first delay sub-system receives one of the path control signals and outputs the first delayed path control signal into the multiplexer, and a second delay sub-system coupled to the multiplexer wherein the second delay sub-system receives another of the path control signals and outputs the second delayed path control signal to the multiplexer.

10. The transmission system according to claim 9, wherein:

the one complementary pass gate comprises a first field effect transistor and a second field effect transistor wherein a drain and a source of the first field effect transistor are respectively coupled to a drain and a source of the second field effect transistor and wherein a gate of the first field effect transistor receives the first CMOS signal input and a gate of the second field effect transistor receives the second CMOS signal input and wherein the first output of the CMOS signals is provided at the drain of the first field effect transistor and the drain of the second field effect transistor when the one complementary pass gate is closed, the another complementary pass gate comprises a third field effect transistor and a fourth field effect transistor wherein a drain and a source of the third field effect transistor are respectively coupled to a drain and a source of the fourth field effect transistor and wherein a gate of the third field effect transistor receives the first CMOS signal input and a gate of the fourth field effect transistor receives the second CMOS signal input and wherein the second output of the CMOS signals is provided at the drain of the third field effect transistor and the drain of the fourth field effect transistor when the another complementary pass gate is closed, and wherein parasitic capacitance exist within the one complementary pass gate and the another complementary pass gate.

11. The transmission system according to claim 8, wherein:

the another set of components for providing the another path to ground further comprises two diode components and a resistor wherein an end of one of the two diodes is coupled to the another complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground.

12. The transmission system according to claim 8, wherein the multiplexer comprises:

at least one bipolar junction transistor for receiving the first output of the CMOS signals from the converter sub-system, and at least another bipolar junction transistor for receiving the second output of the CMOS signals from the converter sub-system.

13. A method of using a transmission system for sending a large number of CMOS signals into a quiet analog power domain comprising:

providing a high level voltage reference from a constant current source, coupling one complementary pass gate that acts as one complementary switch on one side of the constant current source and another complementary pass gate that acts as another complementary switch to another side of the constant current source, coupling one set of components to the one complementary pass gate for providing one path to ground from the constant current source through the one complementary pass gate, wherein the one set of components comprises two diode components and a resistor wherein an end of one of the two diodes is coupled to the one complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground, coupling another set of components to the another complementary pass gate for providing another path to ground from the constant current source through the another complementary pass gate, receiving a first CMOS signal input and a second CMOS signal input at the one complementary pass gate and receiving the second CMOS signal input and the first CMOS signal input at the another complementary pass gate, closing the one complementary pass gate to provide the one complementary switch as closed, opening the another complementary pass gate to provide the another complementary switch as open, and selecting a first output of the CMOS signals from the one complementary pass gate when the first CMOS signal input is high and the second CMOS signal input is low, opening the one complementary pass gate to provide the one complementary switch as open, closing the another complementary pass gate to provide the another complementary switch as closed, and selecting a second output of the CMOS signals from the another complementary pass gate when the first CMOS signal input is low and the second CMOS signal input is high, and coupling a multiplexer to a converter sub-system wherein the multiplexer receives the converted CMOS signals from the converter sub-system and also receives path control signals for controlling path flow of the converted CMOS signals.

14. The method according to claim 13, wherein:

the one complementary pass gate comprises a first field effect transistor and a second field effect transistor wherein a drain and a source of the first field effect transistor are respectively coupled to a drain and a source of the second field effect transistor and wherein a gate of the first field effect transistor receives the first CMOS signal input and a gate of the second field effect transistor receives the second CMOS signal input and wherein the first output of the CMOS signals is provided at the drain of the first field effect transistor and the drain of the second field effect transistor when the one complementary pass gate is closed, the another complementary pass gate comprises a third field effect transistor and a fourth field effect transistor wherein a drain and a source of the third field effect transistor are respectively coupled to a drain and a source of the fourth field effect transistor and wherein a gate of the third field effect transistor receives the first CMOS signal input and a gate of the fourth field effect transistor receives the second CMOS signal input and wherein the second output of the CMOS signals is provided at the drain of the third field effect transistor and the drain of the fourth field effect transistor when the another complementary pass gate is closed, and wherein parasitic capacitance exist within the one complementary pass gate and the another complementary pass gate.

15. The method according to claim 13, wherein:

the another set of components for providing the another path to ground further comprises two diode components and a resistor wherein an end of one of the two diodes is coupled to the another complementary pass gate and wherein another end of the one of the two diodes is coupled to an end of another of the two diodes and another end of the another of the two diodes is coupled to ground and wherein one end of the resistor is coupled to the end of the another of the two diodes and another end of the resistor is coupled to ground.

16. The method according to claim 13, wherein the step of coupling the multiplexer further comprises the steps of:

providing the multiplexer with at least one bipolar junction transistor for receiving the first output of the CMOS signals from the converter sub-system, and providing the multiplexer with at least another bipolar junction transistor for receiving the second output of the CMOS signals from the converter sub-system.

* * * * *